United States Patent
Alelyunas et al.

(10) Patent No.: US 6,553,087 B1
(45) Date of Patent: Apr. 22, 2003

(54) INTERPOLATING BANDPASS FILTER FOR PACKET-DATA RECEIVER SYNCHRONIZATION

(75) Inventors: Carl H. Alelyunas, Nevada City, CA (US); Philip DesJardins, Nevada City, CA (US)

(73) Assignee: 2Wire, Inc., San Jose, CA (US)

( * ) Notice: Subject to any disclaimer, the term of this patent is extended or adjusted under 35 U.S.C. 154(b) by 49 days.

(21) Appl. No.: 09/848,814

(22) Filed: May 4, 2001

Related U.S. Application Data

(60) Provisional application No. 60/202,081, filed on May 4, 2000.

(51) Int. Cl.[7] .................................................. H04L 7/00
(52) U.S. Cl. ...................... 375/357; 375/355; 375/362; 370/516
(58) Field of Search ................... 375/324, 325, 375/326, 327, 341, 262, 350, 355, 357, 362, 371; 370/503, 516, 517; 360/46, 51, 65

(56) References Cited

U.S. PATENT DOCUMENTS

| | | | | |
|---|---|---|---|---|
| 5,457,456 A | * | 10/1995 | Norsworthy | 341/143 |
| 5,471,411 A | * | 11/1995 | Adams et al. | 708/300 |
| 5,793,821 A | * | 8/1998 | Norrell et al. | 375/326 |
| 5,835,295 A | * | 11/1998 | Behrens | 360/51 |
| 6,005,901 A | * | 12/1999 | Linz | 341/123 |
| 6,061,410 A | * | 5/2000 | Linz | 341/123 |
| 6,307,900 B1 | * | 10/2001 | Choi | 375/262 |
| 6,314,145 B1 | * | 11/2001 | van Driest | 375/326 |
| 6,377,634 B1 | * | 4/2002 | Yamamoto | 375/324 |

* cited by examiner

*Primary Examiner*—Chi Pham
*Assistant Examiner*—Khanh Cong Tran
(74) *Attorney, Agent, or Firm*—Carr & Ferrell LLP

(57) ABSTRACT

An interpolating bandpass filter for packet-data receiver synchronization comprises a single delay line that delays the passband-sampled data from the analog-to-digital converter, and a convolving structure that uses the delay line to implement a L-times oversampling bandpass filter. A separate accumulator accumulates a fractional phase difference that represents the frequency offset between the remote transmitter's frequency and the receiver's sampling frequency. The integer portion of the accumulator is used to determine the number of samples to delay the input of the filter, while the fractional portion is used to choose two coefficient sets closest to the desired delay and to interpolate between these two filter sets.

17 Claims, 8 Drawing Sheets

INTERPOLATING BANDPASS FILTER FOR PACKET-DATA RECEIVER SYNCHRONIZATION

CROSS-REFERENCE TO RELATED APPLICATION

This application is related to, and claims the benefit of, U.S. Provisional Patent Application Serial No. 60/202,081 entitled "Interpolating Bandpass Filter for Packet-Data Receiver Synchronization," filed May 4, 2000, the subject matter of which is hereby incorporated by reference.

BACKGROUND OF THE INVENTION

1. Field of the Invention

The present invention relates generally to demodulation of communication signals and more particularly to an interpolating bandpass filter for packet-data receiver synchronization.

2. Description of the Background Art

In network communications a carrier signal, a signal that oscillates at a fixed frequency, is used to establish the base frequency at which data signals are transmitted. These data signals modulate the carrier frequency prior to transmission.

Normally, it is desirable to demodulate data signals from their carrier communication signal using a digital method. It is further desirable to sample the communication signal at a rate greater than two times the maximum frequency of the modulated signal. This process is known as passband sampling.

Typically, demodulating a sampled data stream requires a "matched filter" for optimum performance. This "matched filter" is usually implemented as a bandpass filter with the signal being sampled in the passband. A bandpass filter is an electronic device that prohibits all but the specific range of frequency of the desired modulation to pass through, thus rejecting interference and noise that may be present in the sampled data stream. Often, this "matched filter" is implemented as a finite-impulse response (FIR) digital filter.

It is common for a demodulator to require a sample rate to be interpolated to a different rate for later application to an equalizer structure. This sample rate change is necessary when the original sampling rate is not the same frequency as the sampled rate in the receiver structure. Typically, the receiver structure requires synchronization with the far-end transmitter. This synchronization is usually accomplished with a phase-locked loop on the clock to the analog-to-digital converter or some interpolating FIR structure on the received sample stream. Conventionally, the "matched filter" and the interpolation functions are performed by separate and distinct elements in a receiver. Some transmission standards, particularly those that involve more than two transceiver units, mandate that data are transmitted in packets. An example of such a transmission standard is described in the Home Phoneline Network Alliance (referred to herein as "HomePNA" or "HPNA") 2.0 standard. The HPNA standard requires a receiver to synchronize its local clock to that of the remote transmitter clock for the duration of the transmitted packet. Details regarding the HPNA 2.0 standard are disclosed in "Interface Specification for HomePNA 2.02.7 10M8 Technology" by Home Phoneline Networking Alliance, herein incorporated by reference.

SUMMARY OF THE INVENTION

In general, the present invention provides an interpolating bandpass filter capable of synchronizing packet data received by the receiver device. The system of the invention includes a single multi-tapped delay line that delays the passband-sampled data from the analog-to-digital converter. A convolving structure in conjunction with the multi-tapped delay line implements a finite impulse response (FIR) filter, which has multiple coefficient sets. The coefficient sets are selected to implement an L-times oversampling bandpass filter.

A separate-accumulator accumulates a fractional phase difference that represents the frequency offset between the remote transmitter's frequency and the receiver's sampling frequency. The integer portion of the phase difference is used to determine the number of samples to delay the input of the FIR filter, while the fractional portion is used to choose two filter sets closest to the desired delay and to interpolate between these two filter sets.

In the preferred embodiment, a coefficient generator stores 32 coefficients divided into even and odd coefficients. The fractional portion of the phase difference is split into two components. One component determines a subset of coefficients from the even coefficients and a subset of coefficients from the odd coefficients, and the other component is used to interpolate between these two subsets to provide coefficients that are convolved with input samples.

Other advantages, features, and embodiments of the present invention will be apparent from the drawings and detailed description as set forth below.

DETAILED DESCRIPTION OF THE INVENTION

Figure 1:
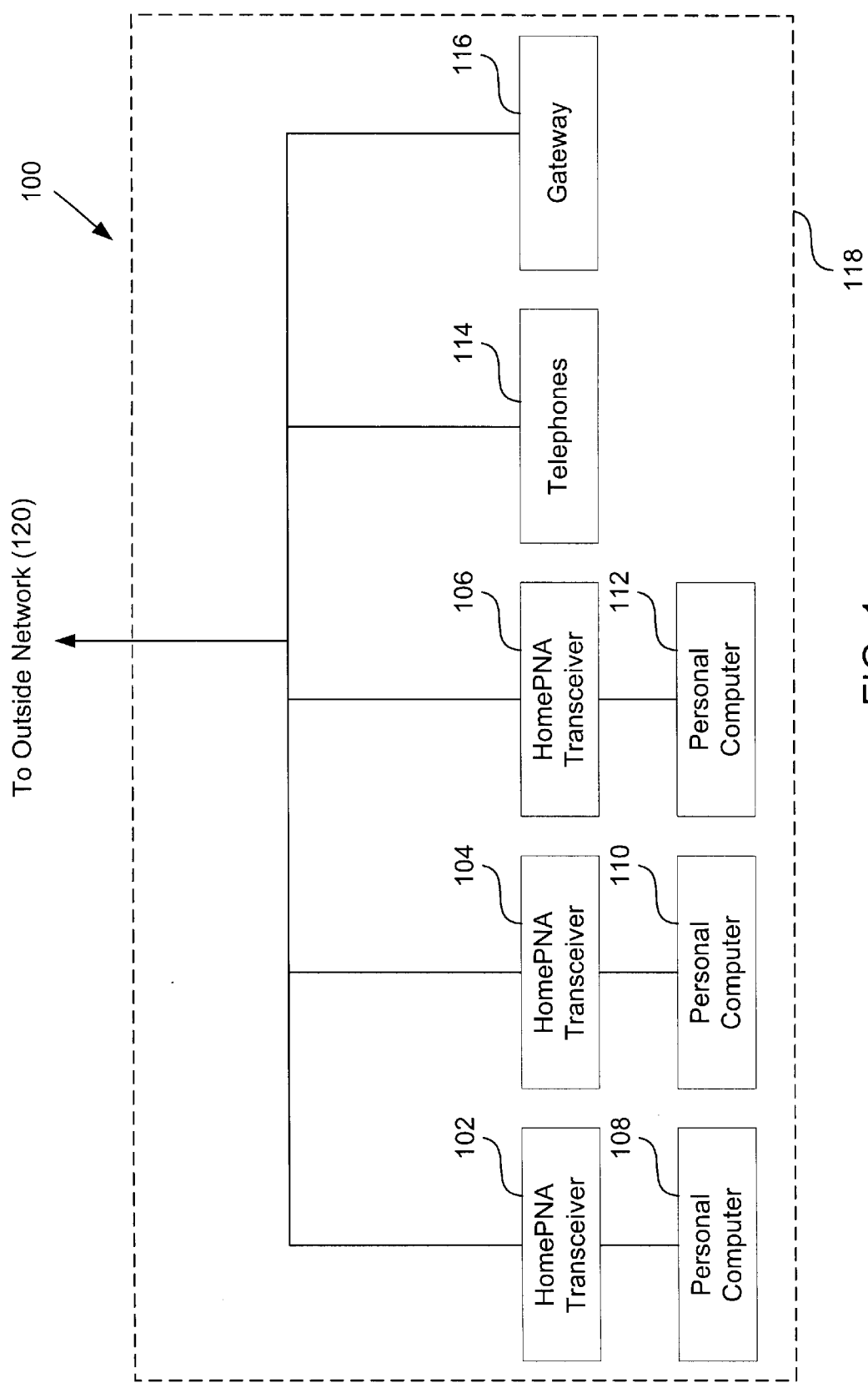
FIG. 1 is a block diagram illustrating a home telephone wiring network.

FIG. 1 is a block diagram illustrating a home telephone wiring network 100 that includes transceivers 102, 104, and 106 for transmitting and receiving data packets, such as those in accordance with the HPNA standards. Each of the transceivers 102, 104, and 106 are coupled to a personal computer 108, 110, and 112, respectively. Network 100 also includes a telephone 114 and a gateway 116. All of the components of network 100 are disposed in a building 118, such as a home. As shown, network 100 is coupled to an outside network 120, which may include a local loop connected to a central office.

According to one embodiment, any one of transceivers 102, 104, and 106 can act as a data packet broadcaster with the other transceivers functioning as endpoints for the data packets. Alternatively, gateway 116 may function as the data packet broadcaster with all three transceivers 102, 104, and 106 acting as endpoints. Additionally, other embodiments may contain more or fewer transceivers.

Figure 2:
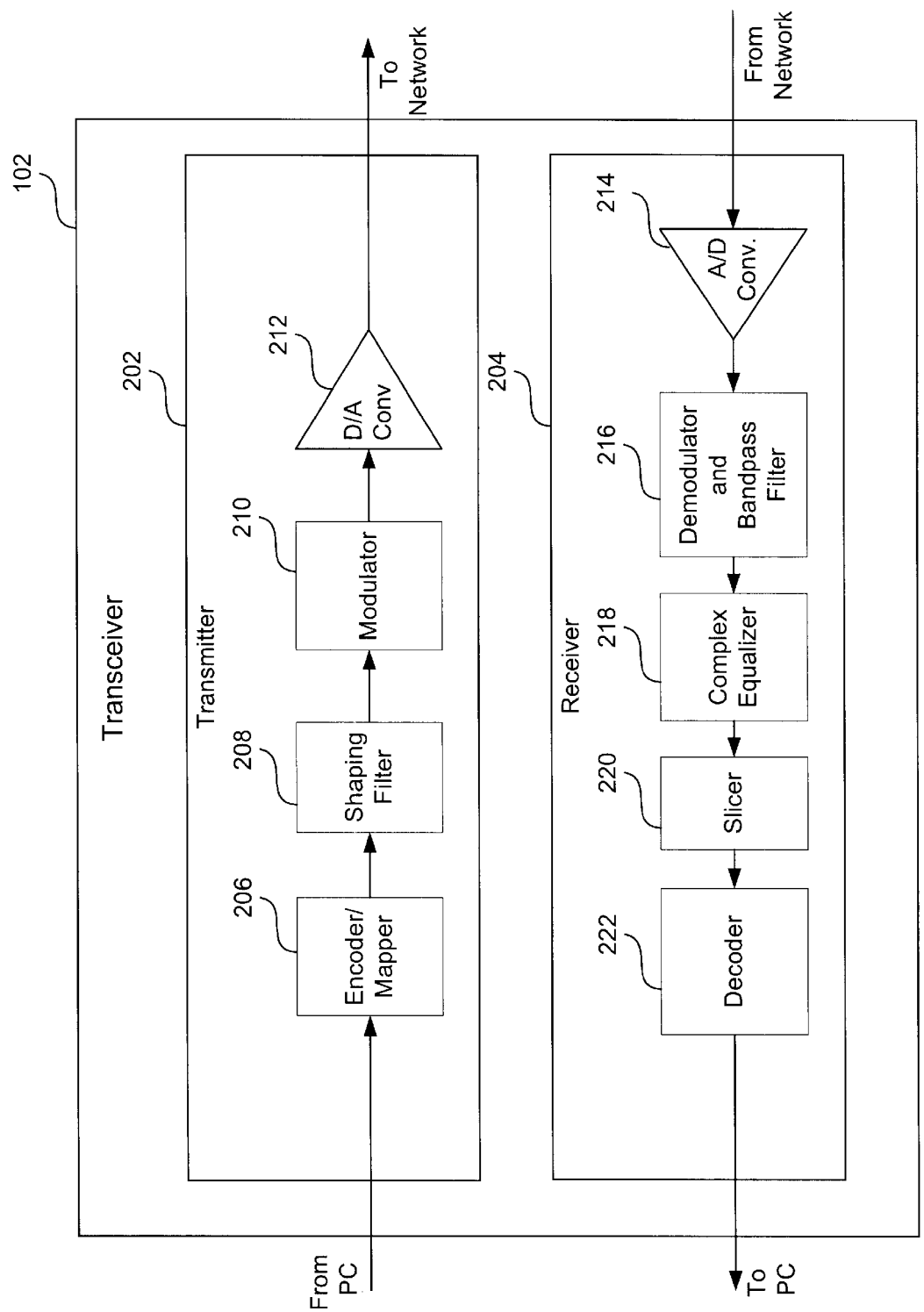
FIG. 2 is a block diagram of a transceiver of the home telephone wiring network of FIG. 1.

FIG. 2 is a block diagram of one embodiment of transceiver 102 of FIG. 1. As shown, transceiver 102 includes a transmitter 202 for transmitting data from the personal computer 108 (FIG. 1) to the network 100 (FIG. 1) and a receiver 204 for receiving data from network 100 and providing the received data to personal computer 108. Transceivers 104 and 106 of FIG. 1 are configured in an identical fashion to transceiver 102.

Transmitter 202 includes, but is not limited to, an encoder/mapper 206, a shaping filter 208, a modulator 210, and a digital-to-analog (D/A) converter 212. When transceiver 102 is functioning as a broadcaster, transmitter 202 receives data bits for transmission from the associated device, such as personal computer 108 (FIG. 1), and sends these data packets to various receivers or endpoints on network 100. Encoder/mapper 206 maps the data bits received from the personal computer 108 to signal levels. The signal levels then proceed through filter 208 and modulator 210 before D/A converter 212 converts the data to an analog signal for transmission through network 100.

Receiver 204 includes, but is not limited to, an analog-to-digital (A/D) converter 214, a demodulator and bandpass filter 216, a complex equalizer 218, a slicer 220, and a decoder 222. When transceiver 102 is functioning as an endpoint, data packets are initially received from the network 100 by the receiver 204 of the endpoint device and converted to digital form by A/D converter 214. The data then passes to demodulator and bandpass filter 216, which interpolates the sample rate of the received data in order to synchronize the rate of receiver 204 with the rate of the transmitting device. The contents and functionality of demodulator and bandpass filter 216 are further discussed below in conjunction with FIGS. 3–6. After demodulator and bandpass filter 216 has processed the data, complex equalizer 218 suppresses intersymbol interference in the demodulated data. Slicer 220 then chooses from a set of possible valid receivable levels a level, or "point"; which most closely matches the current received signal level. Finally, decoder 222 converts this selected point to a set of bits in a bit stream.

Figure 3:
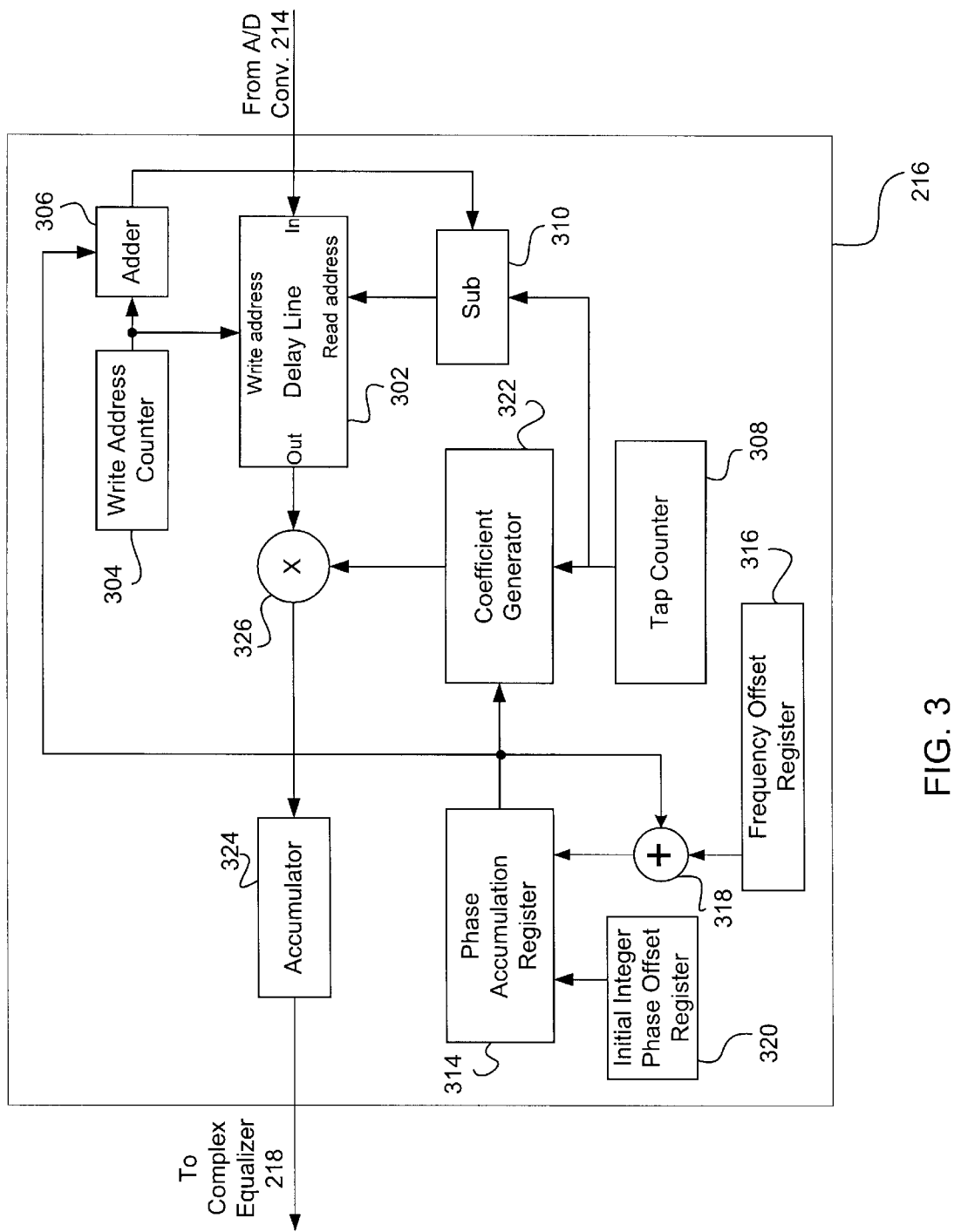
FIG. 3 is a block diagram of one embodiment of the demodulator and bandpass filter of FIG. 2, according to the invention.

FIG. 3 is a block diagram of one embodiment of the demodulator and bandpass filter 216 of FIG. 2 including, but not limited to, a delay line 302, a write address counter 304, an adder 306, a tap counter 308, a subtractor 310, a phase accumulation register 314, a frequency offset register 316, an adder 318, an initial integer phase offset register 320, a coefficient generator 322, and a convolving structure including a multiplier 326 and an accumulator 324.

Received samples from A/D converter 214 are applied to delay line 302, which shifts its contents each time A/D converter 214 is clocked. In the preferred embodiment delay line 302 is implemented as a random access memory (RAM). For each received sample, write address counter 304 provides a write address to delay line 302 and increments after the sample is stored in delay line 302. The write address is also provided to adder 306, which sums the write address and an integer portion of a phase offset from phase accumulation register 314. This sum is provided to subtractor 310, which subtracts an output of tap counter 308 from the sum of adder 306 and provides the difference to delay line 302 as a read address. The read address determines the number of samples to delay the input to filter 216.

For each output of filter 216, tap counter 308 counts N times, from 0 to N–1, where N is the number of input samples used in the interpolation. In the preferred embodiment N=4. Multiplier 326 combines N coefficients from coefficient generator 322 with N samples from delay line 302, and accumulator 324 sums the products to obtain a filtered output that is applied to complex equalizer 218 (FIG. 2). Coefficient generator 322 generates the N coefficients using a fractional portion of a phase difference from phase accumulation register 314. Three embodiments of coefficient generator 322 are discussed below in conjunction with FIGS. 4–6.

Phase accumulation register 314 accumulates a difference in phase between a clock of receiver 104 and a clock of the remote transmitter (not shown). The bits in phase accumulation register 314 represent a phase difference in fractions of a sample as well as integer samples, which allows for fine time-granularity in the resampled output of filter 216. The integer portion of the phase difference in phase accumulation register 314 is provided to adder 306 and the fractional portion of the phase difference in phase accumulation register 314 is provided to coefficient generator 322. Both the integer and fractional portions of the phase difference are provided to adder 318, which adds the phase difference to a frequency offset value from frequency offset register 316. The sum is then stored in phase accumulation register 314. In a preferred embodiment, the phase difference in the phase accumulation register is updated every clock cycle of receiver 104, when A/D converter 214 is clocked.

Before the reception of a packet, frequency offset register 316 is set to zero, and phase accumulation register 314 is loaded with a value stored in initial integer phase offset register 320. In the preferred embodiment, this value represents one half of the depth of delay line 302, which allows phase accumulation register 314 to advance or retard an equal amount without overflowing the depth of delay line 302. The depth of this delay line is proportional to the maximum length of the packet as well as the highest anticipated sample frequency difference between the receiver and the remote transmitter. Given a maximum anticipated sample frequency offset of 200 parts per million of nominal sampling rate of 28 million samples/second, combined with a maximum packet length of 3 milliseconds, a delay line of 32 samples is sufficient to account for the time skew of a single packet. When a packet begins to be received, frequency offset register 316 is updated with an estimated frequency difference between the local and remote clocks.

Figure 4:
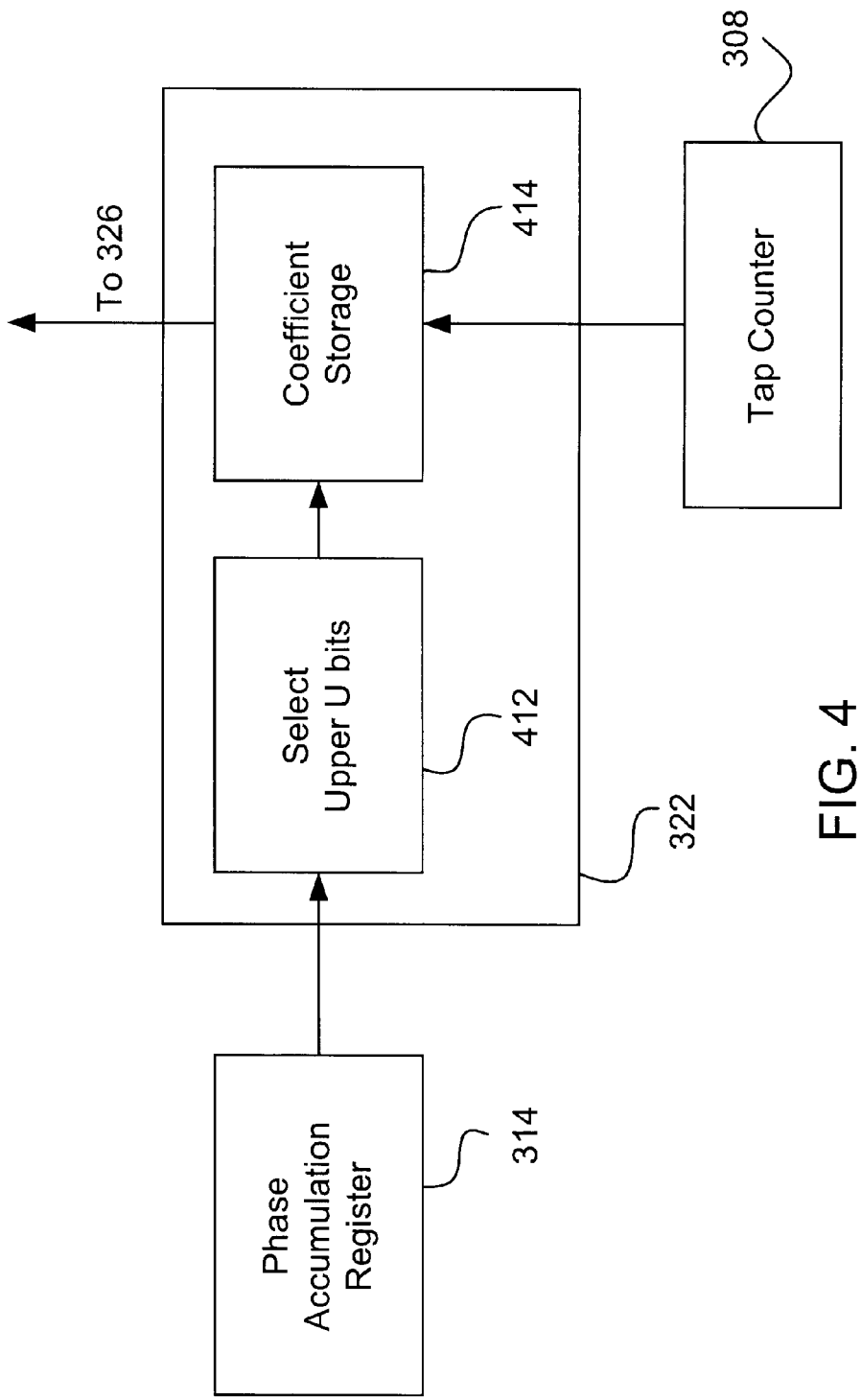
FIG. 4 shows one embodiment of the coefficient generator of FIG. 3, according to the invention.

FIG. 4 shows a block diagram of one embodiment of coefficient generator 322 of FIG. 3, according to the invention. Phase accumulation register 314 outputs bits representing a fractional portion of a phase difference, which is an unsigned number between zero and one. A select 412 presents an upper U bits of the fractional portion of the phase difference to coefficient storage 414. In one embodiment U=4. The values of the U bits define an integer number J. For example, where U=4 and if the four bit values are 0101, then J=5.

Coefficient storage 414 uses the U bits to determine a number of subfilters, S, where $S=2^U$. In the embodiment where U=4, then S=16 and coefficient storage 414 determines 16 subfilters. In this embodiment, a predetermined set of 64 coefficients stored in coefficient storage 414 provides 4 coefficient values for each subfilter. When applied to received data samples by multiplier 326 and accumulator 324, each 4-coefficient subfilter performs a fractional-sample interpolation of a J/S sample (J/S is always less than one). J selects the coefficients of the subfilter by addressing the $J^{th}$ subfilter of S subfilters stored in a coefficient memory storage such as a ROM. Each of the S subfilters has N taps, so the total size of the ROM is N*S coefficients; if N=4 and S=16 then the ROM holds 64 coefficients. The address bits of the ROM are split into 2 groups; one group is the subfilter address consisting of U bits, and the other group is the tap address from tap counter 308 consisting of $n=\log_2(N)$ bits.

To have a fine granularity in filter 216 a high number of subfilters are needed, requiring a large coefficient storage. As discussed below in conjunction with FIG. 5, the size of this storage can be greatly reduced if fewer subfilters are stored and a device interpolates between those fewer stored subfilters.

Figure 5:
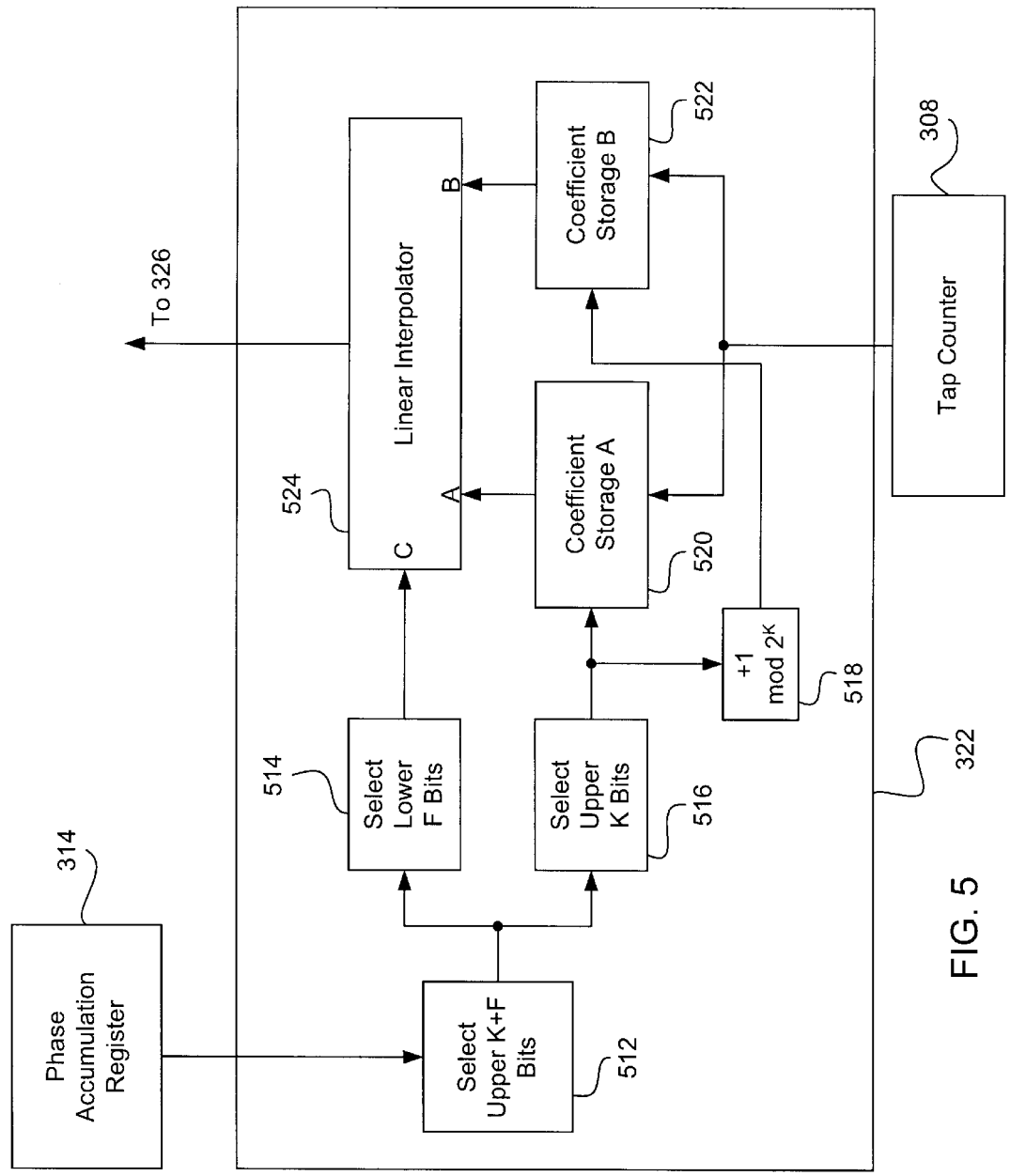
FIG. 5 shows another embodiment of the coefficient generator of FIG. 3, according to the invention.

FIG. 5 shows another embodiment of coefficient generator 322 of FIG. 2, according to the invention. A select 512 selects an upper K+F bits of the fractional portion of the phase difference from phase accumulation register 314. A select 514 then selects the lower F bits and a select 516 selects the upper K bits. In one embodiment, F=6 and K=3. The F bits are provided to a C input of a linear interpolator 524, where the value of the F bits ranges from 0 to $(1-2^{-F})$. The K bits are applied to a coefficient storage A 520 and to an incrementer 518, which adds one to the value of the K bits and applies that value to a coefficient storage B 522. The K bits define a value Q and the output of incrementer 518 defines a value Q+1.

Similarly to coefficient storage 414 of FIG. 4, coefficient storage A 520 and coefficient storage B 522 produce filter coefficient values based on the value of Q and Q+1, respectively. Coefficient storage A 520 and coefficient storage B 522 include sets of $R=2^K$ coefficient values, such that where K=3,R=8. Coefficient storage A 520 provides filter coefficients to an A input of linear interpolator 524, and coefficient storage B 522 provides filter coefficients to a B input of linear interpolator 524. Linear interpolator 524 interpolates between the filter coefficients of input A and input B using the value represented by the F bits provided to input C; the value at the C input is interpreted as C=(value represented by the F bits)/$2^{-F}$, which is a value between zero and $1-2^F$. In the FIG. 5 embodiment, linear interpolator 524 is a mixer device that produces output according to the equation A*(1−C)+B*C.

The coefficient sets in coefficient storage A 520 and coefficient storage B 522 are nearly identical; they differ only in the $0^{th}$ subfilter. When the address input to coefficient storage A 520 is $2^K-1$, then the address to coefficient storage B 522 is 0; this is because the addresses are represented by K bits and so $2^K$ maps to 0. The $0^{th}$ subfilter in coefficient storage B 522 is the same as the subfilter in coefficient storage A 520 corresponding to Q=0, except that the coefficients of the subfilter of coefficient storage B 522 have been delayed by one sample. This one-sample delay enables linear interpolator 524 to interpolate from a fractional delay of $1-2^{-U}$ samples to a unity sample delay.

The output of linear interpolator 524 is a set of $2^{K+F}$ interpolated coefficients similar in value to the coefficients $2^U$ produced by the coefficient generator of FIG. 4. The reason for the similarity is that if K is sufficiently large, new coefficients between any two existing neighboring coefficients can be approximated by a straight-line fit. However, the FIG. 5 embodiment of coefficient generator 322 substitutes low cost linear interpolator 524 for expensive, large coefficient storage 414. Thus, the FIG. 5 embodiment of coefficient generator 322 is more cost effective than the FIG. 4 embodiment of coefficient generator 322. The preferred embodiment, discussed below in conjunction with FIG. 6, improves on this cost savings by further reducing the necessary size of the coefficient storage memories.

Figure 6:
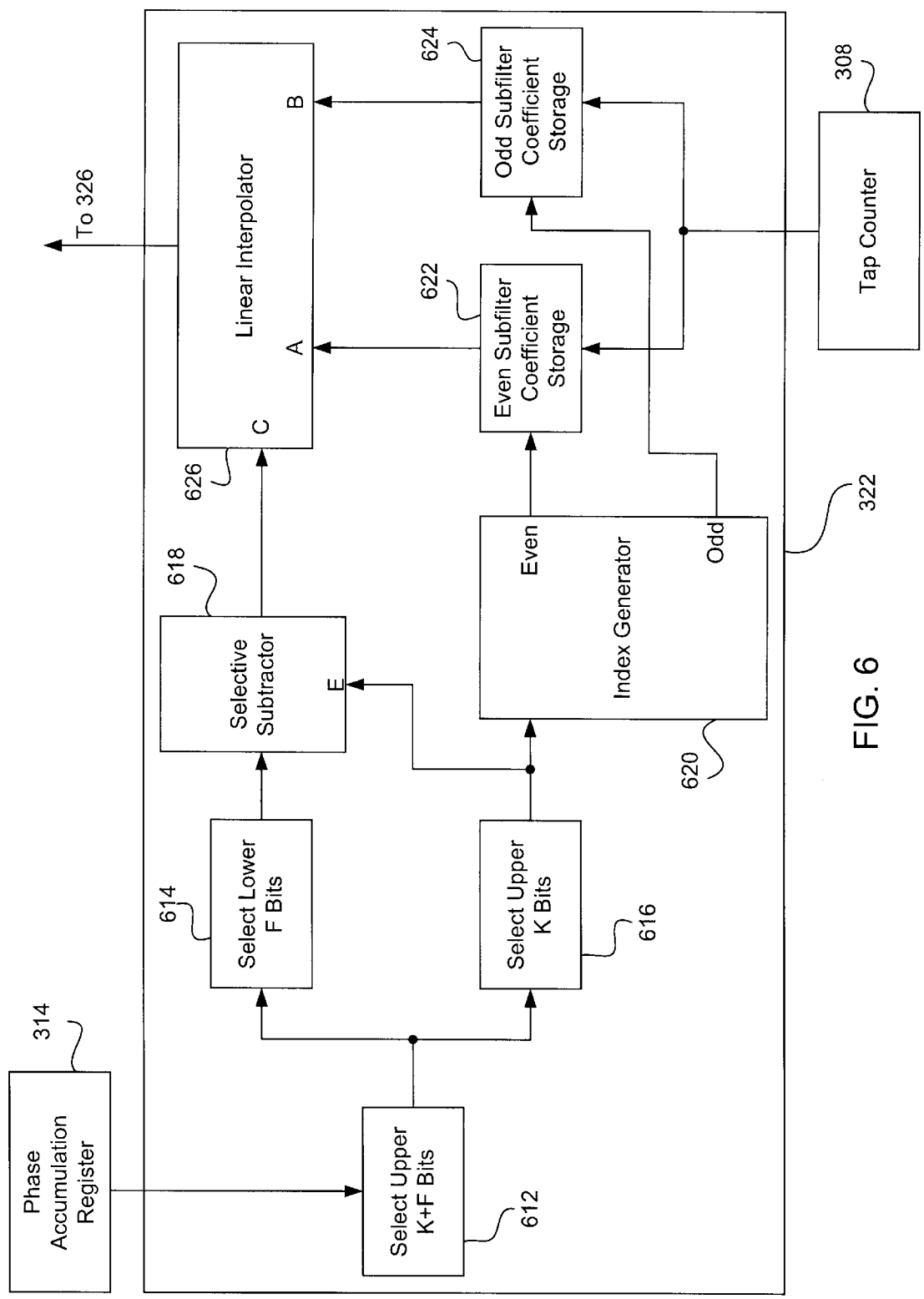
FIG. 6 shows the preferred embodiment of the coefficient generator of FIG. 3, to the invention.

FIG. 6 shows the preferred embodiment of coefficient generator 322 of FIG. 3, according to the invention. A select 612 selects an upper K+F bits of the fractional portion of the phase difference from phase accumulation register 314. A select 614 selects a lower F bits and provides them to a selective subtractor 618. A select 616 selects an upper K bits and provides them to an index generator 620. In the preferred embodiment F=6 and K=3. The F bits from select 614 define a fractional value M that ranges from 0 to $1-2^{-F}$. Selective subtractor 618 performs according to the value of a select bit E, which is the most significant bit of the K bits from select 616. When the select bit is zero, selective subtractor 618 passes the value M to a C input of a linear interpolator 626. When the select bit is one, selective subtractor 618 subtracts M from unity (creating 1−M) and provides this difference to the C input of linear interpolator 626.

The K bits from select 616 define a value X that index generator 620 uses to generate sets of indices. Index generator 620 provides even index values to an even subfilter coefficient storage 622 and odd index values to an odd subfilter coefficient storage 624. Even subfilter coefficient storage 622 holds the coefficients for all the even-indexed subfilters described in the embodiments of FIGS. 4 & 5, and odd subfilter coefficient storage 624 holds the coefficients for all the odd-indexed subfilters described in those embodiments. Even subfilter coefficient storage 622 is configured to store a subfilter that is the same as the $0^{th}$ subfilter shifted by one sample; this subfilter is stored in index $2^K$, giving $2^K+1$ total subfilters stored in even subfilter coefficient storage 622.

Similarly to coefficient storage 414 of FIG. 4, even coefficient storage 622 provides coefficient values to input A of linear interpolator 626 and odd coefficient storage 624 provides coefficient values to input B of linear interpolator 626. Linear interpolator 626 then produces 64 filter coefficient values according to the equation A*(1−C)+B*C. When interpolating from an even-indexed filter to an odd-indexed filter, such as from 4 to 5, C is equal to M. When interpolating from an odd-indexed filter to an even-indexed filter, such as from 5 to 6, C is equal to 1−M.

Index generator 620 converts the K bits that specify the subfilter index into two separate indices, one for even subfilter coefficient storage 622 and one for odd subfilter coefficient storage 624. Index generator 620 passes the upper K−1 of the K bits to create the odd index; that is, ODD_INDEX=floor(INDEX/2), where "floor" is a function that takes the closest integer that is less than or equal to the input. Index generator 620 forms the even subfilter index via the equation EVEN_INDEX=floor((INDEX+1)/2).

While the embodiment of FIG. 5 requires two copies of the coefficient store, one for the A input and the other for the B input of linear interpolator 524, the FIG. 6 embodiment of coefficient generator 322 splits the set of 8 subfilters into two groups, odd and even. Thus the FIG. 6 embodiment of coefficient generator 322 requires half the coefficient storage capacity of the FIG. 5 embodiment of coefficient generator 322.

The FIG. 6 embodiment of coefficient generator 322 is preferably implemented in accordance with the Home Phoneline Networking Alliance (HPNA) 2.0 specification. The input sampling frequency (i.e., the clock frequency of A/D converter 214) is 28 million samples/second. The coefficients stored in even coefficient storage 622 and odd coefficient storage 624 are derived from an interpolating bandpass filter with a sample rate of 8 ($=2^K$) times the input sampling frequency, or 224 million samples/second. Each subfilter has 4 coefficients, meaning that the oversampled filter 216 has 4*8=32 coefficients. The number of bits F used to interpolate between coefficients is 6, which provides sufficient resolution in the subphase to reduce interpolation error to 1000/(28*2048) nanoseconds. The size of the coefficient storage (even coefficient storage 622 and odd coefficient storage 624 combined) is such that the total accumulated phase difference in phase accumulation register 314 from a maximum length packet transmitted from a transmitter with a remote clock frequency that is 200 ppm different from the local reference clock frequency will not overflow the depth of delay line 302.

Figure 7:
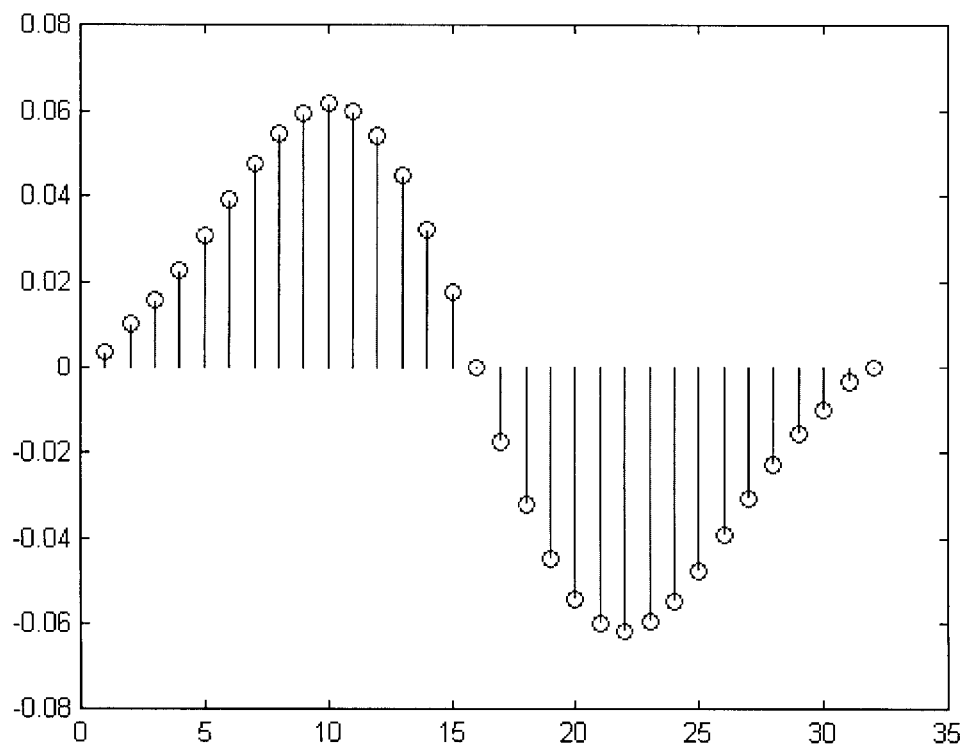
FIG. 7 is a graph of the preferred coefficients for the demodulating and bandpass filter of FIG. 2.

FIG. 7 shows the preferred coefficients of a 32 tap bandpass filter sampled at 28 million samples/second with low frequency cutoff at 4 MHz and a high frequency cutoff at 10 MHz. In the preferred embodiment of FIG. 6, 5 subfilters (corresponding to subfilters 0, 2, 4, 6 and 8) are stored in even coefficient storage 622 and 4 subfilters (corresponding to subfilters 1, 3, 5 and 7) are stored in odd coefficient storage 624. The interpolation rate for filter 216 implementing the FIG. 6 embodiment of coefficient generator 322 is 8:1, resulting in a super-sampling frequency of 224 million samples/second. The coefficients shown in FIG. 7 are divided into 8 sets, each representing one oversampling phase, of 4 coefficients each. An oversampling filter with N*L taps, where L is the oversampling rate, need only perform N multiplications per output sample. Thus, in the preferred embodiment filter 216 (FIG. 2) need only perform four multiplications per output sample.

The coefficient values shown in FIG. 7 are determined by taking the complex discrete Fourier transform of an impulse which is equal to one at frequencies from 4 to 10 MHz, equal to negative one at frequencies between −4 and 31 10 MHz, and zero everywhere else. A Hamming window is then applied to limit the number of coefficients to 32. Alternatively, other digital filter design techniques may be used to yield appropriate coefficients.

Figure 8:
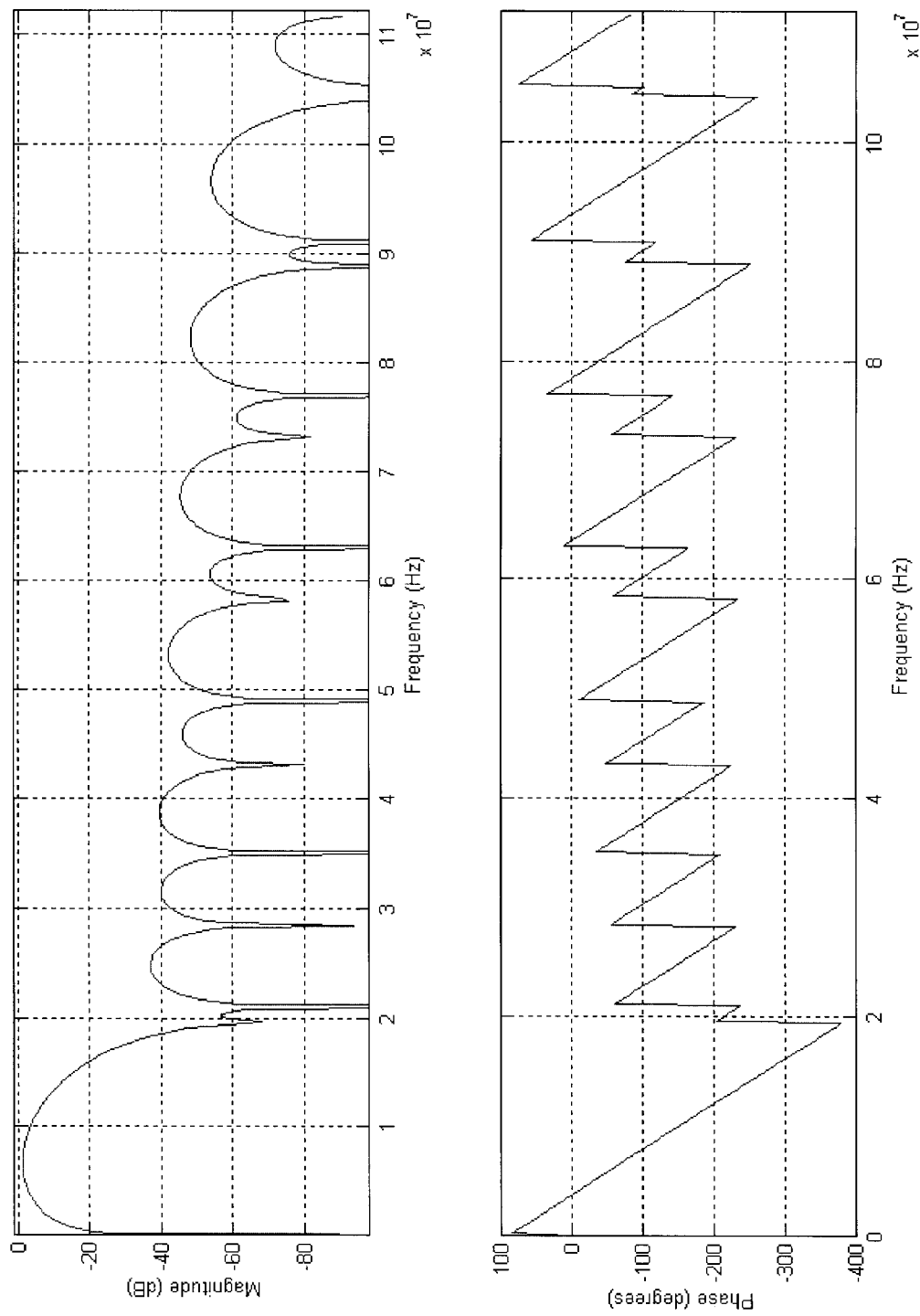
FIG. 8 is a graph of a frequency response of the demodulating and bandpass filter of FIG. 2 having the coefficients of FIG. 7.

FIG. 8 shows the frequency response of the coefficients of FIG. 7 with a sampling rate of 224 million samples/second. The low frequency cutoff occurs at 4 MHz and the high frequency cutoff occurs at 10 MHz.

What is claimed is:

1. An interpolating bandpass filter in a receiver, the filter comprising:
   a delay line configured to receive samples of a received signal;
   a convolving structure configured to receive delayed samples from the delay line, wherein an integer portion of a phase difference between a transmitter's clock and the receiver's clock determines an amount of delay in the delay line; and
   a coefficient generator configured to generate filter coefficients using a fractional portion of the phase difference, the coefficient generator inputting the filter coefficients to the convolving structure which convolves the filter coefficients and the delayed samples to produce filtered samples.

2. The interpolating bandpass filter of claim 1, wherein the coefficient generator uses an upper U bits of the fractional portion of the phase difference to select filter coefficients from a set of stored coefficients.

3. The interpolating bandpass filter of claim 2, wherein U equals 4.

4. The interpolating bandpass filter of claim 1, wherein the coefficient generator uses an upper K+F bits of the fractional portion of the phase difference to select two groups of coefficients from a set of stored coefficients and interpolate between the two groups to produce the filter coefficients input to the convolving structure.

5. The interpolating bandpass filter of claim 4, wherein K=3.

6. The interpolating bandpass filter of claim 4, wherein F=6.

7. The interpolating bandpass filter of claim 4, wherein the value of the K bits is used to select a first group of coefficients from the set of stored coefficients and the value of the K bits incremented by one is used to select a second group of coefficients from the set of stored coefficients.

8. The interpolating bandpass filter of claim 7, wherein the value of the F bits is used to interpolate between the first and second groups of coefficients to produce the filter coefficients input to the convolving structure.

9. The interpolating bandpass filter of claim 8, wherein the coefficient generator includes a linear interpolator that implements the equation A*(1−C)+B*C, where A represents the first group of coefficients, B represents the second group of coefficients, and C represents the value of the F bits divided by $2^F$.

10. The interpolating bandpass filter of claim 7, wherein the coefficient generator includes two copies of the stored coefficients, where the first set of coefficients is selected from one copy of the stored coefficients and the second set of coefficients is selected from the other copy of the stored coefficients.

11. The interpolating bandpass filter of claim 4, wherein the set of stored coefficients is separated into a set of stored coefficients of even indexed subfilters at a set of stored coefficients of odd indexed subfilters, the coefficient generator includes an index generator that uses the value of the K bits to generate even indices for the set of stored coefficients of even indexed subfilters and odd indices for the set of stored coefficients of odd indexed subfilters, and the even indices select even subfilter coefficients and the odd indices select odd subfilter coefficients.

12. The interpolating bandpass filter of claim 11, wherein the coefficient generator includes a linear interpolator that implements the equation A*(1−C)+B*C, where A represents the even filter coefficients, B represents the odd filter coefficients, and C represents the value of the F bits divided by $2^F$ when the most significant bit of the K bits is zero and represents the value of one minus the value of the F bits divided by $2^F$ when the most significant bit of the K bits is one.

13. A method for generating interpolating bandpass filter coefficients, comprising the steps of:
   storing a predetermined set of filter coefficients as a set of coefficients for even indexed subfilters and a set of coefficients for odd indexed subfilters;
   determining a phase difference between a remote transmitter's clock and a receiver's clock;
   selecting a fractional portion of the phase difference;
   selecting an upper K+F bits of the fractional portion of the phase difference;
   using the K bits to determine an even coefficient index and an odd coefficient index;
   using the even coefficient index to select an even subfilter from the set of coefficients of even indexed subfilters and using the odd coefficient index to select an odd subfilter from the set of coefficients of odd indexed subfilters; and interpolating between the even subfilter and the odd subfilter using the F bits to produce the interpolating bandpass filter coefficients.

14. The method of claim 13, wherein the step of interpolating between the even subfilter and the odd subfilter includes using the value of the F bits divided by $2^F$ when the most significant bit of the K bits is zero.

15. The method of claim 13, wherein the step of interpolating between the even subfilter and the odd subfilter includes using one minus the value of the F bits divided by $2^F$ when the most significant bit of the K bits is one.

16. The method of claim 13, wherein the interpolating bandpass filter coefficients are used to interpolate and bandpass filter samples of data signals that conform to a Home Phoneline Networking Alliance communication standard.

17. A system for efficient storage of filter coefficients, comprising:

an even subfilter coefficient storage configured to store even subfilter coefficients;

an odd subfilter coefficient storage configured to store odd subfilter coefficients;

an index generator configured to generate an even subfilter index and an odd subfilter index; and a linear interpolator configured to interpolate between even subfilter coefficients selected according to the even subfilter index and odd subfilter coefficients selected according to the odd subfilter index.

* * * * *